(12) United States Patent
Patapoutian et al.

(10) Patent No.: US 6,236,340 B1
(45) Date of Patent: May 22, 2001

(54) MODULATION ENCODERS AND DECODERS

(75) Inventors: Ara Patapoutian, Westboro; Lih-Jyh Weng, Needham, both of MA (US)

(73) Assignee: Quantum Corporation, Milpitas, CA (US)

( * ) Notice: Subject to any disclaimer, the term of this patent is extended or adjusted under 35 U.S.C. 154(b) by 0 days.

(21) Appl. No.: 09/225,259

(22) Filed: Jan. 4, 1999

(51) Int. Cl.$^7$ ........................................... H03M 7/00
(52) U.S. Cl. ..................................... 341/58; 341/83
(58) Field of Search ........................ 341/58, 59, 83

(56) References Cited

U.S. PATENT DOCUMENTS

| | | | | |
|---|---|---|---|---|
| 5,144,304 | * | 9/1992 | McMahon | 341/58 |
| 5,347,276 | * | 9/1994 | Gilardi | 341/59 |
| 5,640,285 | * | 6/1997 | Maurice et al. | 360/46 |
| 6,018,304 | * | 1/2000 | Bessios | 341/58 |

* cited by examiner

*Primary Examiner*—Howard L. Williams
(74) *Attorney, Agent, or Firm*—Cesari & McKenna

(57) ABSTRACT

A modulation encoder includes a base conversion circuit that converts a partitioned input data stream from a first base representation in accordance with the size of groups of bits in the partitioned stream into a second base representation. The base conversion circuit includes a circuit to produce intermediate values of the partitioned stream in the second base representation and a residual value logic circuit that performs modulo-arithmetic on intermediate values modulo the second base representation, and a one's complement logic network fed by the residual value logic to produce output code words. A modulation decoder includes a one's complement logic circuit fed by modulation code words to produces residual value words; and a base conversion circuit that converts residual value words from a first base representation into a second base representation to provide original user data.

31 Claims, 2 Drawing Sheets

MODULATION ENCODERS AND DECODERS

BACKGROUND

This invention relates to modulation encoders for magnetic storage devices.

Modulation codes are often used in magnetic storage devices to insure that a long string of "0's" is not present in a data stream stored on the magnetic storage device. For example, in a tape drive system the presence of a long string of zeros exceeding a constraint value k can cause a circuit with a phase lock loop device that reads/writes data to/from the storage device to lose lock and produce catastrophic data errors.

Different types of magnetic storage systems prioritize code properties such as, timing updates and error propagation characteristics, differently. For tape systems having a small k constraint value (frequent timing updates) is more important than in disk drives, since tape systems require a larger tolerance to velocity changes. On the other hand, if the tape uses an error control scheme such as error detection along a track, as current digital linear tape (DLT) systems do, then minimizing error propagation will have a lower priority.

One type of modulation coding technique uses a table look up to produce code words in response to user data.

One type of modulation code is the so called "block code" technique. In a block code data are operated on a block basis and for m number of bits into an encoder, n number of bits come out. The code rate for such a code is given as m/n. In one type of block code, a redundant "pivot" bit is added in the encoded codeword. This pivot bit flags whether there was any need for encoding. If the pivot bit is "1" for example this could signify that the data was not encoded, whereas a "0" would indicate that it was encoded because a k constraint violation had occurred. Usually, such codes are simple to implement but start getting inefficient at higher code rates. A second block code is to use an available block code with a code rate of (n−1)/n code for small n and insert interleaved p non-coded bits, resulting in an (n+p−1)/(n+p) code. Such codes are high code-rate, simple to construct and usually have good error propagation properties, but result in large k values. They may be suitable for disk drive applications but are not generally suitable for tape systems.

SUMMARY

According to an aspect of the invention, a modulation encoder includes a base conversion circuit that converts a partitioned input data stream from a first base representation in accordance with the size of groups of bits in the partitioned stream into a second base representation. The base conversion circuit includes a circuit to produce intermediate values of the partitioned stream in the second base representation and a residual value logic circuit that performs modulo-arithmetic on intermediate values modulo the second base representation, and a one's complement logic network fed by the residual value logic to produce output code words.

According to an additional aspect of the invention, a modulation decoder includes a one's complement logic circuit fed by modulation code words to produces residual value words; and a base conversion circuit that converts residual value words from a first base representation into a second base representation to provide original user data.

One or more of the following advantages are provided by the above encoder and/or decoder. The above provides an encoder and/or decoder that has a very high code rate, with a low value of k constraint, that is relatively easy to implement. In addition the maximum error propagation (if the error event is 4 bits or less) is limited to eight bytes for 32/33 codes, ten bytes for 40/41 codes, and six bytes for 24/25 codes. This is accomplished without significantly reducing code rate, relaxing the k constraint or using prohibitively complex implementations.

DETAILED DESCRIPTION

Figure 1:
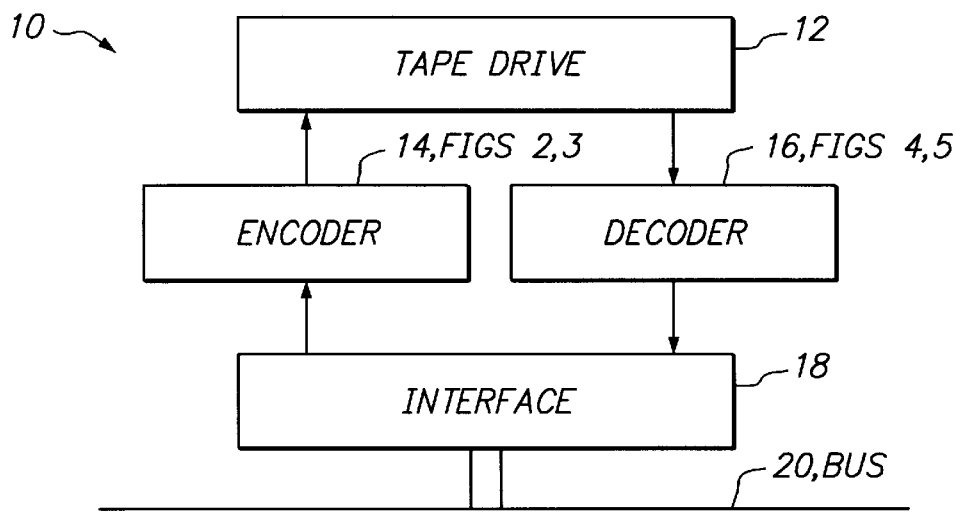
FIG. 1 is a block diagram of a magnetic storage system.

Referring now to FIG. 1, a magnetic storage system 10 is shown. The magnetic storage system 10 can be a disk drive or, as illustrated, a tape drive system 12 and includes a modulation encoder 14 and a modulation decoder 16. The modulation encoder 14 implements a so-called (n−1)/n modulation code. The encoder 14 receives user data via an interface 18 which is coupled to a bus 20 that may be part of a larger computer system (not shown). The encoder 14 encodes the data in such a manner that the data is constrained to satisfy several properties of the encoding algorithm.

The encoder 14 provides a procedure for the tape drive, to encode user data such that the data is encoded at a high code rate i.e., efficient format. The encoder has relatively low hardware complexity compared to a general table look up for a frequency of timing update that is small (i.e., a small k constraint value). The encoder 14 also has short error propagation properties at the modulation decoder output. The data are encoded at a high code rate to provide an efficient format for a given constraint value k on the modulation code. In particular, the encoder takes user data and ensures that there is not a consecutive string of zeros of the value k which may otherwise result in loss of phase lock in data retrieval circuits (not shown) of the tape drive system 10.

The value of the constraint "k" is related to the base of the representation of nibbles (groups of bits) in the codeword as $$k=2(\lceil \log_2 n \rceil -1)$$

where n is the base representation and $\lceil \log_2 n \rceil$ operates on $\log_2 n$ to provide the highest integer, to force k to be an integer quantity.

The encoder 14 includes circuits or a process to convert user data from a first base representation, as determined by the size of the nibble into a second base representation. Thus, the encoder 14 converts from a $b^n$ representation to a $b^n-1$ representation. The encoder 14 avoids patterns of groups of bits in the second base representation which could result in a constraint violation (i.e., have more than k number of zeros) in an output to the tape system 10. Examples are set out below where the $b^n$ representation is base 16 and the $b^n-1$ representation is base 15. Other nibble sizes represented in other bases can be used.

The decoder 16, when reading from the tape drive 12, decodes the data to provide the original user data to the interface 18.

Figure 2:
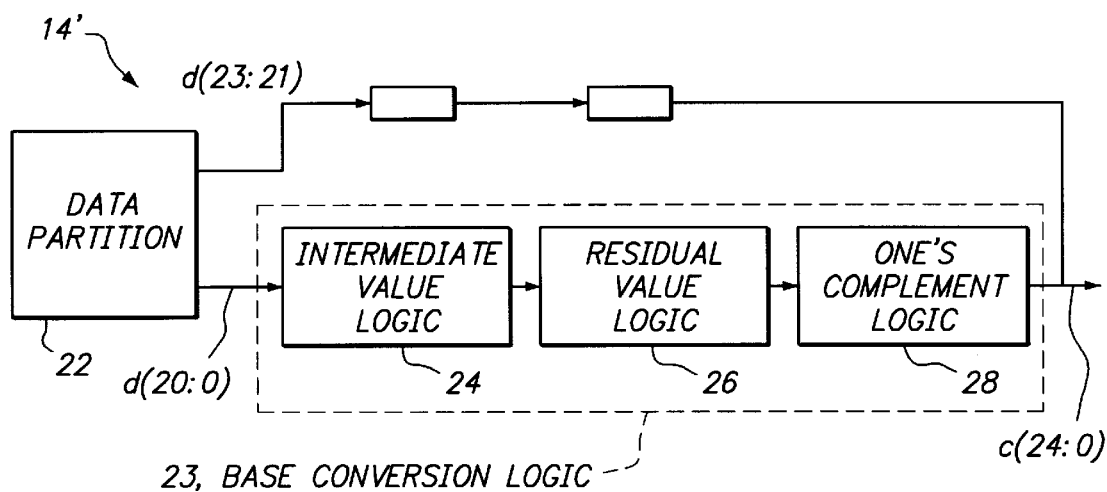
FIG. 2 is a block diagram of a modulation encoder for the system of FIG. 1.

Referring now to FIG. 2, an embodiment 14' of the encoder 14 includes a data partitioner 22 that receives an input data stream $d_i$ and partitions the input data stream into blocks of data d(23:0) which are here 24 bits in length. This scheme takes input data bits d(23:0) and produces code word bits c(24:0) for a code rate of 24/25. The encoder 14' couples the three most significant bits d(23:21) of the partitioned data stream d(23:0), to the output of the encoder 14' providing code bits c(24:22). Therefore, the code bits c(24:22) are not encoded. This feature is used to limit error propagation between two adjacent blocks of data. The remaining bits d(20:0) of the partitioned data stream are fed to a base conversion circuit 23.

The base conversion circuit 23 includes an intermediate value circuit 24, residual value circuit 26 and one's complement logic 28. The base conversion circuit 23 receives the partitioned data stream and converts the arithmetic base of the partitioned data stream ($b^n$) into a different base ($b^n-1$) in which the value of zero is not used.

The intermediate value circuit 24 converts the partitioned input data stream bits d(20:0) from a base 16 representation into a base 15 representation. The intermediate values b0–b5, are found as:

```
b0{7:0} = d(3:0) + d(7:4) +  d(11:8) +  d(15:12) +  d(19:16) + d(20),
b1{7:0} =          d(7:4) + 2d(11:8) + 3d(15:12) + 4d(19:16) + 5d(20)
b2{7:0} =                    d(11:8) +3d(15:12) + 6d(19:16) + 10d(20)
b3{7:0} =                                d(15:12) + 4d(19:16) + 10d(20)
b4{5:0} =                                           d(19:16) +  6d(20)
b5{1:0} =                                                        2d(20)
```

The intermediate values provided from the intermediate value logic 26 are fed to the residual value logic 26. Although the intermediate values may be in a base 15 representation they may not be in a range of values between 0–14. This can be accomplished by feeding the intermediary values b0–b5, to the residual logic 26.

The residual value logic 26 operates on the code words by performing modulo 15 arithmetic. If a carry is produced, it is propagated to the succeeding bit position. The residual carry logic thus produces code words comprising groups of four bits in the range of 0 to 14 (for base 15) or three bits (for base 7) in the range of 0 to 7, or 0 to 5 for the last one of the groups of bits. The residual values are calculated as follows:

```
for i=0 to 3
    if (bi(7:4) + bi(3:0)) < 15
        r(3+4i:4i) = bi(7:4) + bi(3:0)
        bi+1(7:0) = bi+1(7:0) + bi(7:4) (1sb)
    else
        r(3+4i:4i) = bi(7:4) + bi(3:0) - 15
        bi+1(7:0) = bi+1(7:0) + bi(7:4) (1sb) + 1
    end
end
if (b4(7:4) + b4(3:0)) < 7
    r(18:16) = b4(5:3) + b4(2:0)
    r(21:19) = b5(1:0) + b4(5:3)
else
    r(18:16) = b4(5:3) + b4(2:0) - 7
    r(21:19) = b5(1:0) + b4(5:3) + 1
end
```

The code set out above includes an inexpensive manner to perform a division operation. In essence, division by $b^n$ is an easy operation simply involving a shift of n places to the right (i.e., towards the lsb) in the dividend. Therefore, division in this code is accomplished, iteratively by a shift and subtraction, relatively quickly and inexpensively.

The residual value logic 28 performs modulo 15 or modulo 7 arithmetic (successively dividing by 15 or 7 to produce remainders of less than 15 or 7) on groups of bits of the code words depending upon whether the groups of bits in the code words contain 4 or 3 bits. If a carry is propagated from the modulo arithmetic operation, then the carry is added to the succeeding bit position, as shown in the code with the operation of the "if" statement. Therefore, the residual logic 26 operates on the intermediate values provided from the base conversion logic 26 modulo 15 to produce groups of code words in the range of 0 to 14 for groups of four bits, and modulo 7 to produce groups of code words in the range of 0 to 6 for groups of three bits.

The residual value logic 26 produces residual values that are fed to a one's complement logic network 30 to produce output code words c(22:0). The one's complement logic insures that there is no group of bits (i.e., 4 bits for base 16 and base 15) in the data stream which will be all zeros. A constraint violation could occur if there were any groups of bits of all zeros in a code word. Therefore, each neighbor group will have a non-zero value in its code word.

The code word c(22:0) is the permuted ones' complement of residual values given by:

$$c(21:19)=\text{NOT}(r(21:19)), c(18:3)=\text{NOT}(r(15:0)), c(2:0)=\text{NOT}(r(18:16))$$

The code word bits c(22:0) are concatenated with the code word bits c(24:22) derived from the original input data d(23:21) and together provide the output code word bits c(24:0) for the circuit. The code word c(22:0) is permuted i.e. the order of bits are changed with code bits c(18:3)=NOT(r(15:0)), and code bits c(2:0)=NOT(r(18:16)) so that there will not be a k violation no matter what the value of the non-coded bits c(25:23) turns out to be.

Figure 3:
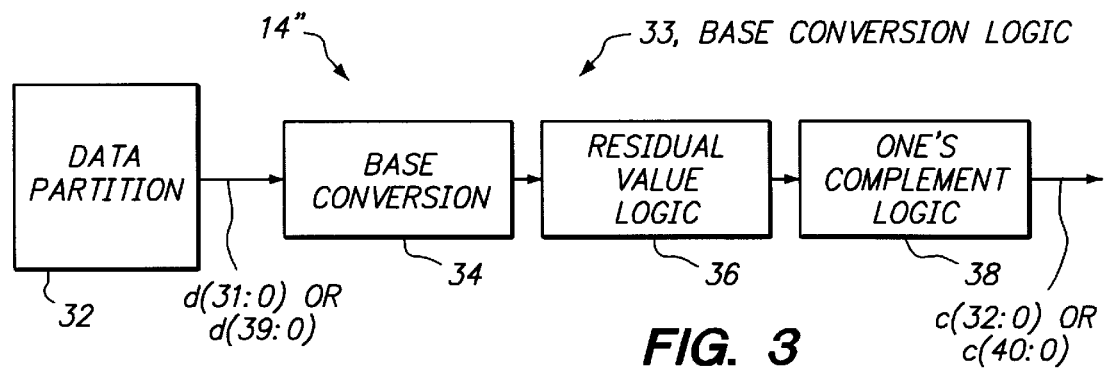
FIG. 3 is a block diagram of an alternate embodiment of a modulation encoder.

Referring now to FIG. 3, a second embodiment 14" of the encoder 14 includes a data partitioner 32 that receives an input data stream $d_i$ and partitions the input data stream into blocks of data. Two examples are described, 32 bits and 40 bits. Details for each different block partitioning will be discussed separately.

For the first partition of 32 bits, the partitioned data stream d(31:0), is fed to a base conversion circuit 33. This scheme takes input data bits d(31:0) and produces code word bits c(32:0) for a code rate of 31/32. The base conversion circuit 33 includes an intermediate value circuit 34, residual value circuit 36 and one's complement logic 38. The base conversion circuit 33 receives the partitioned data stream and converts the arithmetic base of the partitioned data stream ($b^n$) into a different base ($b^n-1$) in which the value of zero is not used.

The intermediate value circuit 34 receives the partitioned data stream and converts the arithmetic base of the partitioned data stream d(32:0) from a base 16 representation into a base 15 representation. The intermediate values are found by a matrix multiplication where a matrix W can be defined as:

$$W = \begin{matrix} 1 & 1 & 1 & 1 & 1 & 1 & 1 & 1; \\ 0 & 1 & 2 & 3 & 4 & 5 & 6 & 7; \\ 0 & 0 & 1 & 3 & 6 & 10 & 0 & 6; \\ 0 & 0 & 0 & 1 & 4 & 10 & 6 & 6; \\ 0 & 0 & 0 & 0 & 1 & 5 & 1 & 7; \\ 0 & 0 & 0 & 0 & 0 & 1 & 7 & 8; \\ 0 & 0 & 0 & 0 & 0 & 0 & 1 & 8; \\ 0 & 0 & 0 & 0 & 0 & 0 & 0 & 1; \end{matrix}$$

The intermediate numbers b{7:0} can be arrived at by multiplying the transpose matrix dd' of the partitioned data matrix dd by the matrix W as:

$$dd=\{d(31:28)\ d(27:24)\ d(23:20)\ d(19:16)\ d(15:12)\ d(11:8)\ d(7:4)\ d(3:0)\}$$

$$b\{7:0\}=W*dd';$$

The intermediate numbers b{7:0} provided from the intermediate value logic 34 are fed to the residual value logic 36. The residual value logic 36 operates on the partitioned data by performing modulo-arithmetic. In particular, the residual value logic 36 will operate on the intermediate values modulo 15. The residual value logic 36 also propagates carries to succeeding bit positions. The residual carry logic 36 thus produces code words in the range of 0 to 14.

```
q(0) = 0;
for i=0:6
    B(i)    = b(i) + q(i);
    r(3+4i:4i) = rem(B(i),15);
    q(i+1)  = floor(B(i)/15);
end
r(32:28)    = b(7) + q(7);
```

The code above, implements real division. Alternatively, the division technique described above, could be used by dividing the dividend to produce a quotient and remainder and successively dividing any remainder by 15 until the remainder is less than 15.

The residual logic 36 looks for a string "01111" in the last five bits. A "k" constraint violation can result if this string is present. The violation can occur when the ones' complement is taken of "011111" if it is adjacent a group of bits "1110" such that the one's complement of both strings is a string "100000001" that contains seven zeros. Therefore, the string 01111 is replaced by an unused string "11101" in the encoded bit stream. Thus, the one's complement of this combination "11101" and "01111" will produce a string "000100001" which does not have a constraint violation.

```
if (r(32:28)=='01111')
    r(32:28)='11101';
end
```

The residual value logic produces residual values that are fed to a one's complement logic network 40 to produce output code words C(32:0) as:

$$c(32:0)=NOT\ (r(32:0));$$

The one's complement logic 40 insures that there is no group of bits (i.e., 4 bits for base 16 and base 15) in the data stream which will be all zeros. If there were any groups of bits of all zeros that would violate the constraint imposed by the value of K. Therefore, each neighbor group has a non-zero value in its code word.

A second partition value can be used with the encoder 14". The encoder 14" can have the partitioner 32 partition data into 40 bit code words. This scheme takes input data bits d(39:0) and produces code word bits c(40:0) for a code rate of 40/41. The base conversion circuit 33 converts the arithmetic base of the partitioned data stream into a different base in which the value of zero is not used, as described above. The matrix W for a 40 bit code is defined as:

| W = 1 | 1 | 1 | 1 | 1 | 1 | 1 | 1 | 1 | 1; |
|---|---|---|---|---|---|---|---|---|---|
| 0 | 1 | 2 | 3 | 4 | 5 | 6 | 7 | 8 | 9; |
| 0 | 0 | 1 | 3 | 6 | 10 | 0 | 6 | 13 | 6; |
| 0 | 0 | 0 | 1 | 4 | 10 | 6 | 6 | 12 | 11; |
| 0 | 0 | 0 | 0 | 1 | 5 | 1 | 7 | 13 | 11; |
| 0 | 0 | 0 | 0 | 0 | 1 | 7 | 8 | 0 | 14; |
| 0 | 0 | 0 | 0 | 0 | 0 | 1 | 8 | 2 | 2; |
| 0 | 0 | 0 | 0 | 0 | 0 | 0 | 1 | 10 | 12; |
| 0 | 0 | 0 | 0 | 0 | 0 | 0 | 0 | 1 | 11; |
| 0 | 0 | 0 | 0 | 0 | 0 | 0 | 0 | 0 | 1; |

As above, the intermediate values can be arrived at by matrix multiplication, by multiplying the transposed matrix dd', of the partitioned data matrix dd, by the matrix W as:

$$dd=\{d(39:36)\ d(35:32)\ d(31:28)\ d(27:24)\ d(23:20)\ d(19:16)\ d(15:12)\ d(11:8)\ d(7:4)\ d(3:0)\}$$

$$b\{9:0\}=W*dd';$$

where b{i} is an integer.

The intermediate numbers b{9:0} provided from the intermediate value logic 34 are fed to the residual value logic 36. The residual value logic 36 operates on the partitioned data by performing modulo-arithmetic. In particular, the residual conversion logic will operate on the intermediate values modulo 15. The residual value logic also propagates carries to succeeding bit positions. The residual carry logic thus produces code words in the range of 0 to 14, as for the 32-bit partition above.

```
q(0) = 0;
for i=0:8
    B(i)    = b(i) + q(1);
    r(3+4i:4i) = rem(B(i),15);
    q(i+1)  = floor(B(i)/15);
end
r(40:36)    = b(9) + q(9);
```

The residual logic 36, as above for the 32 bit partition, looks for a string "01111" in the last five bits and replaces it with "11101".

```
if (r(40:36)=='01111')
    r(40:36)='11101';
end
```

The residual value logic 36 produces residual values that are fed to the one's complement logic network 40 to produce output code words c(40:0) as:

$$c(40:0)=NOT(r(40:0));$$

The one's complement logic 40 insures that there is no group of bits (i.e., 4 bits for base 16 and base 15) in the data stream which will be all zeros. If there were any groups of bits of all zeros that would violate the constraint imposed by the value of k. Therefore, each neighbor group has a non-zero value in its code word.

Figure 4:
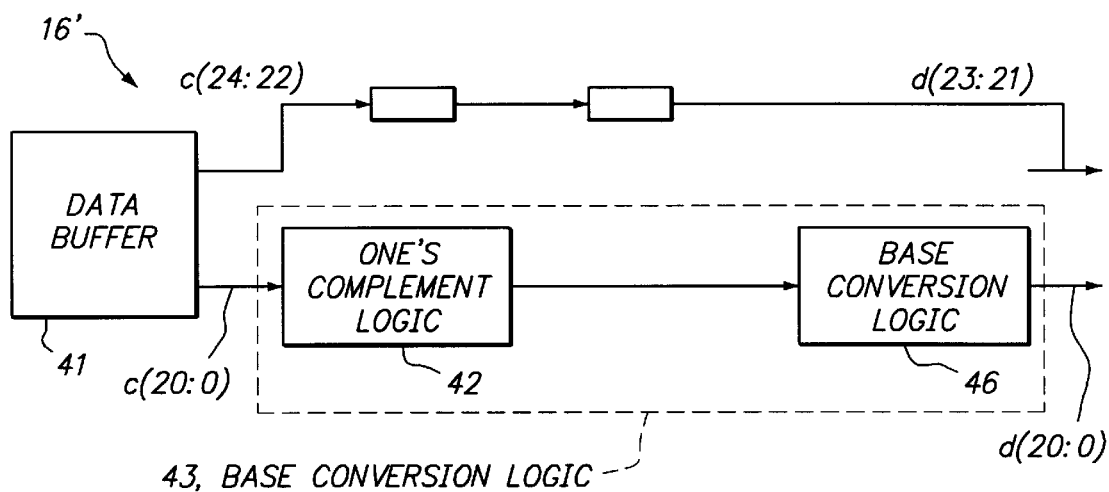
FIG. 4 is a block diagram of a modulation decoder for the encoder of FIG. 2.

Referring now to FIG. 4, an embodiment 16' of the decoder 16 is shown. The decoder 16' is used with code words that are encoded with a 24 bit code length such as provided by the encoder 14' (FIG. 2). The decoder 16' can include a buffer 42 or other device to hold code words from the tape drive system 10. The decoder 16 reverses the operations that were performed by the encoder (FIG. 2) on the user data. Therefore, the decoder 16 includes a one's complement logic circuit 42 which produces the one's complement of the code bits c(21:0). The one's complement logic also depermutes the code word by restoring the proper bit positions of the bits in the residual values.

$$r(21:19)=\text{NOT}(c(21:19)),\ r(18:16)=\text{NOT}(c(2:0)),\ r(15:0)=\text{NOT}(c(18:3))$$

The last three code bits c(24:22) are fed directly via registers or other delay elements to the data output d and directly provides data bits d(23:21).

The output of the one's complement logic circuit 42 are the residual bits. The residual bits r(21:0) are fed to a base conversion circuit 46 which converts the residual bits into base 16. The base conversion circuit 46 which produces the original output user bits d(23:0) from:

$$d(22:0)=r(3:0)+15(r(7:4)+15(r(11:8)+15(r(15:12)+15(r(18:16)+7r(21:19)))))$$

Figure 5:
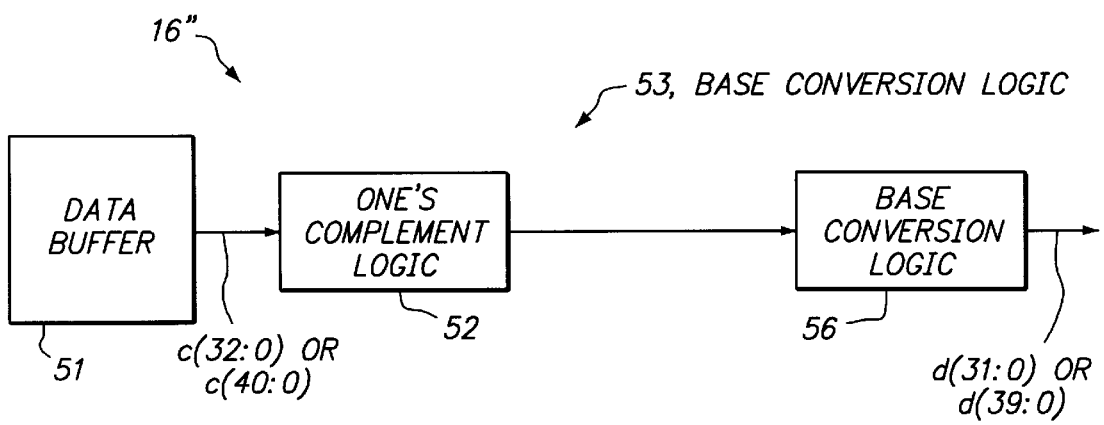
FIG. 5 is a block diagram of an alternate embodiment of a modulation decoder for the encoder of FIG. 3.

Referring now to FIG. 5, an embodiment 16" of the decoder 16 is shown. The decoder 16' is used with code words that are encoded with a 32 or 40 bit code length such as provided by the encoder 14" (FIG. 3). The decoder 16" can include a buffer 51 or other device to hold code words from the tape drive system 10. The decoder 16" reverses the operations that were performed by the encoder 14" (FIG. 3). Therefore, the decoder 16" includes a one's complement logic circuit 52 which produces the one's complement of the code bits c(32:0) by $$r(32:0)=\text{NOT}(c(32:0));$$

and replaces the string "11101", if present, in the last 5 bits of the code word with the string "01111."

if (r(32:28)=='11101')
  r(32:28)='01111';
end

The residual bits are the output of the one's complement logic circuit 52. The residual bits r(32:0) are fed to a base conversion circuit 56 which produces the original user bits d(31:0) from:

$$d(31:0)=r(32:28)+15(r(27:24)+15(r(23:20)+15(r(19:16)+15(r(15:12)+15(r(11:8)+15(r(7:4)+15(r(3:0))))))))$$

The decoder of FIG. 4, also can be used with code words that are encoded with a 40 bit code length such as provided by the encoder 14' (FIG. 3). The decoder 16" includes typically the buffer 51 or other device to hold code words from the tape drive system 10. The decoder 16" reverses the operations that were performed by the encoder 14" (FIG. 3). The one's complement logic circuit 52 produces the one's complement of the code bits c(40:0) according to:

$$r(40:0)=\text{NOT}(c(40:0));$$

and replaces the string "11101", if present, in the last 5 bits of the code word with the string "01111."

if (r(40:36)=='11101')
  r(40:36)='01111';
end

The output of the one's complement logic circuit 42 are the residual bits. The residual bits r(40:0) are fed to the base conversion circuit 46 and produces the original output user bits d(39:0) from:

$$d(39:0)=r(40:36)+(r(35:32)+15(r(31:28)+15(r(27:24)+15(r(23:20)+15(r(19:16)+15(r(15:12)+15(r(11:8)+15(r(7:4)+15(r(3:0)))))))))))$$

The code set out above for the base conversions includes an inexpensive manner to perform a multiplication operation. In essence, multiplication by $b^n$ is an easy operation simply involving a shift of n places to the left (i.e., towards the msb) in the multiplicand. For multiplication by $b^n-1$, this is the same as multiplying by $b^n$ and subtracting 1. Therefore, multiplication in this code is accomplished, iteratively by a shift and subtraction, relatively quickly and inexpensively.

The family of encoders 14 and decoders 16 that were described above have encoding and decoding schemes that result in properties that are useful for tape drives particularity ones with the following requirements:

| code rates | 24/25 | 32/33 | 40/41 |
|---|---|---|---|
| hardware complexity | low | moderate | moderate |
| PLL update | k = 6 | k = 6 | k = 6 |
| max. error propagation | 4 bytes | 8 bytes | 10 bytes. |

The encoders 14 and decoders 16 can be implemented in digital electronic circuitry, or in computer hardware, firmware, software, or in combinations of them. Methods of operating the encoders and decoders can be performed by a programmable processor executing a program of instructions to perform functions by operating on input data and generating output. The encoders and decoders can advantageously be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired. In any case, the language can be a compiled or interpreted language. Suitable processors include, by way of example, both general and special-purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks.

Any of the foregoing can be supplemented by, or incorporated in, ASICs (application-specific integrated circuits). The multiplication of values by 15 or 7 can be accomplished by ($15=2^4-1$), and multiplication by 7 can be accomplished by ($7=2^3-1$). These are equivalent to four or three shifts to the left and then a subtraction. Hence multiplication by 15 or 7 is equivalent to addition. The decoder can always be implemented as combinational logic without the need to clock internal values, Since, speed is not a bottleneck (there is 24 or more cycles to do decoding) ripple adders may be used to save hardware. Similar considerations apply to division and implementations of the encoder.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A modulation encoder comprises:
   a base conversion circuit that converts a partitioned input data stream from a first base representation in accordance with the size of groups of bits in the partitioned stream into a second base representation including:
   a circuit to produce intermediate values of the partitioned stream in the second base representation;
   a residual value logic circuit that performs modulo-arithmetic on intermediate values modulo the second base representation; and
   a one's complement logic network fed by the residual value logic to produce output code words.

2. The modulation encoder of claim 1 wherein the encoder further comprises a data partitioner to provide the partitioned input data stream.

3. The modulation encoder of claim 1 wherein the base conversion circuit insures that a number of values of contiguous zeros in the data stream does not exceed a given value.

4. The modulation encoder of claim 1 wherein the base conversion circuit converts the partitioned input data stream from a base $b^n$ representation into a base $b^n-1$ representation where n is the size of a group of bits that the base conversion circuit operates upon.

5. The encoder of claim 4 wherein the base conversion circuit converts the partitioned input data stream from a base 16 representation into a base 15 representation and the residual logic operates on the intermediate values modulo 15 to produce code words in the range of 0 to 14.

6. The modulation encoder of claim 5 wherein the residual logic determines if a last group of bits from the residual value logic is a string as '01111', and changes it to a string as '11101'.

7. The modulation encoder of claim 4 wherein the encoder is a 32 bit encoder.

8. The modulation encoder of claim 4 wherein the partition bit stream is 32 bits.

9. The modulation encoder of claim 8 wherein the base conversion circuit performs a matrix multiplication, where W is a matrix representing coefficients defined as:

| W = | 1 | 1 | 1 | 1 | 1 | 1 | 1 | 1; |
|---|---|---|---|---|---|---|---|---|
| | 0 | 1 | 2 | 3 | 4 | 5 | 6 | 7; |
| | 0 | 0 | 1 | 3 | 6 | 10 | 0 | 6; |
| | 0 | 0 | 0 | 1 | 4 | 10 | 6 | 6; |
| | 0 | 0 | 0 | 0 | 1 | 5 | 1 | 7; |
| | 0 | 0 | 0 | 0 | 0 | 1 | 7 | 8; |
| | 0 | 0 | 0 | 0 | 0 | 0 | 1 | 8; |
| | 0 | 0 | 0 | 0 | 0 | 0 | 0 | 1; | and dd' is a transposed matrix of a partitioned data matrix dd defined as:

$dd=\{d(31:28)\ d(27:24)\ d(23:20)\ d(19:16)\ d(15:12)\ d(11:8)\ d(7:4)\ d(3:0)\}$ and where the intermediate values b are provided by:

$b\{7:0\}=W*dd'$, and where * is matrix multiplication.

10. The modulation encoder of claim 4 wherein the encoder is a 40 bit encoder.

11. The modulation encoder of claim 10 wherein the partition bit stream is 40 bits.

12. The modulation encoder of claim 11 wherein the base conversion circuit performs a matrix multiplication, where W is a matrix representing coefficients defined as:

| W = 1 | 1 | 1 | 1 | 1 | 1 | 1 | 1 | 1 | 1; |
|---|---|---|---|---|---|---|---|---|---|---|
| 0 | 1 | 2 | 3 | 4 | 5 | 6 | 7 | 8 | 9; |
| 0 | 0 | 1 | 3 | 6 | 10 | 0 | 6 | 13 | 6; |
| 0 | 0 | 0 | 1 | 4 | 10 | 6 | 6 | 12 | 11; |
| 0 | 0 | 0 | 0 | 1 | 5 | 1 | 7 | 13 | 11; |
| 0 | 0 | 0 | 0 | 0 | 1 | 7 | 8 | 0 | 14; |
| 0 | 0 | 0 | 0 | 0 | 0 | 1 | 8 | 2 | 2 |
| 0 | 0 | 0 | 0 | 0 | 0 | 0 | 1 | 10 | 12; |
| 0 | 0 | 0 | 0 | 0 | 0 | 0 | 0 | 1 | 11; |
| 0 | 0 | 0 | 0 | 0 | 0 | 0 | 0 | 0 | 1; | and dd' is a transposed matrix of a partitioned data matrix dd defined as:

$dd=\{d(39:36)\ d(35:32)\ d(31:28)\ d(27:24)\ d(23:20)\ d(19:16)\ d(15:12)\ d(11:8)\ d(7:4)\ d(3:0)\}$ and where the intermediate values b are provided by:

$b\{9:0\}=W*dd'$, where and * is matrix multiplication.

13. The encoder of claim 1 wherein the encoder is a 24 bit encoder.

14. The encoder of claim 1 wherein the partition bit stream is 24 bits.

15. The encoder of claim 13 wherein the encoder passes three bits of the partitioned bit stream to the output of the encoder, as non-encoded code bits.

16. The modulation encoder of claim 15 wherein the base conversion circuit converts groups of contiguous bits in the partitioned input data stream that are in a base 16 representation into a base 15 representation, and converts groups of contiguous bits in the partitioned input data stream that are in a base 8 representation into a base 7 representation.

17. The modulation encoder of claim 16 wherein the base conversion circuit insures that a number of contiguous zeros in the data stream does not exceed a given value.

18. The modulation encoder of claim 17 wherein the base conversion circuit finds the intermediary values b0–b5, as:

$b0\{7:0\} = d(3:0) + d(7:4) + d(11:8) + d(15:12) + d(19:16) + d(20),$
$b1\{7:0\} = d(7:4) + 2d(11:8) + 3d(15:12) + 4d(19:16) + 5d(20)$
$b2\{7:0\} = d(11:8) + 3d(15:12) + 6d(19:16) + 10d(20)$
$b3\{7:0\} = d(15:12) + 4d(19:16) + 10d(20)$
$b4\{5:0\} = d(19:16) + 6d(20)$
$b5\{1:0\} = 2d(20).$

19. A modulation decoder comprises:
   a one's complement logic circuit fed by modulation code words to produces residual value words; and
   a base conversion circuit that converts residual value words from a first base representation into a second base representation to provide original user data.

20. The modulation decoder of claim 19 wherein the base conversion circuit converts the residual values from a base $b^n-1$ representation into a base $b^n$ representation where n is the size of a group of bits that the base conversion circuit operates upon.

21. The modulation decoder of claim 20 wherein the base conversion circuit converts from a base 15 representation into a base 16 representation.

22. The modulation decoder of claim 19 wherein the one's complement logic determines if a last group of bits from the residual value logic is a string as, '11101' and changes it to a string as '01111'.

23. The modulation decoder of claim 22 wherein the decoder is a 32 bit decoder.

24. The modulation decoder of claim 23 wherein the base conversion circuit produces original user bits d(31:0) from:

$$d(31:0)=r(32:28)+15(r(27:24)+15(r(23:20)+15(r(19:16)+15(r(15:12)+15(r(11:8)+15(r(7:4)+15(r(3:0))))))))$$

where r(i:j) are the residual bits from the one's complement logic.

25. The modulation decoder of claim 22 wherein the decoder is a 40 bit decoder.

26. The modulation decoder of claim 25 wherein the base conversion circuit produces original user bits d(39:0) from:

$$d(39:0)=r(40:36)+(r(35:32)+15(r(31:28)+15(r(27:24)+15(r(23:20)+15(r(19:16)+15(r(15:12)+15(r(11:8)+15(r(7:4)+15(r(3:0)))))))))))$$

where r(i:j) are the residual bits from the one's complement logic.

27. The modulation decoder of claim 19 wherein the encoded bit stream is 24 bits.

28. The modulation decoder of claim 19 wherein the decoder passes three bits of the encoded bit stream to the output of the decoder, as non-decoded bits.

29. The modulation decoder of claim 28 wherein the base conversion circuit converts bits in the from a base 15 representation into a base 16 representation, and converts groups of contiguous bits in the partitioned input data stream that are in a base 7 representation into a base 8 representation.

30. The modulation decoder of claim 28 wherein the base conversion circuit produces original output user bits d(23:0) from:

$$d(22:0)=r(3:0)+15(r(7:4)+15(r(11:8)+15(r(15:12)+15(r(18:16)+7r(21:19))))).$$

31. A computer program product residing on a computer readable medium for modulating a data stream comprises instructions for causing a computer:

converts a partitioned input data stream from a first base representation in accordance with the size of groups of bits in the partitioned stream into a second base representation including:
produce intermediate values of the partitioned stream in the second base representation;
performs modulo-arithmetic on the intermediate values modulo to produce residual values in the second base representation; and perform a one's complement on the residual values to produce output code words.

* * * * *